(12) United States Patent
Fang et al.

(10) Patent No.: US 9,490,141 B2
(45) Date of Patent: Nov. 8, 2016

(54) METHOD FOR PLANARIZING SEMICONDUCTOR DEVICE

(71) Applicant: UNITED MICROELECTRONICS CORPORATION, Hsinchu (TW)

(72) Inventors: Wei-Nan Fang, Tainan (TW); Jiann-Shiun Chen, Fenyuan Town (TW); Tzu-Yi Chuang, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/585,210

(22) Filed: Dec. 30, 2014

(65) Prior Publication Data
US 2016/0155649 A1    Jun. 2, 2016

(30) Foreign Application Priority Data
Nov. 27, 2014 (CN) .......................... 2014 1 0697179

(51) Int. Cl.
*H01L 21/321* (2006.01)
*H01L 21/311* (2006.01)
*H01L 21/02* (2006.01)
*H01L 21/285* (2006.01)
*H01L 21/768* (2006.01)

(52) U.S. Cl.
CPC ..... *H01L 21/3212* (2013.01); *H01L 21/02532* (2013.01); *H01L 21/02595* (2013.01); *H01L 21/28525* (2013.01); *H01L 21/31116* (2013.01); *H01L 21/7684* (2013.01); *H01L 21/76877* (2013.01)

(58) Field of Classification Search
CPC ................... H01L 21/3212; H01L 21/02532; H01L 21/02595; H01L 21/28525; H01L 21/31116; H01L 21/7684; H01L 21/76877
See application file for complete search history.

(56) References Cited

U.S. PATENT DOCUMENTS

| 5,872,045 | A * | 2/1999 | Lou ........................ H01L 21/763 257/E21.552 |
| 6,001,730 | A | 12/1999 | Farkas |
| 6,500,729 | B1 * | 12/2002 | Chittipeddi ....... H01L 21/76224 257/E21.546 |
| 6,617,251 | B1 * | 9/2003 | Kamath ............ H01L 21/31055 257/E21.245 |
| 2003/0176151 | A1 * | 9/2003 | Tam .................... B24B 37/0056 451/41 |
| 2006/0088999 | A1 * | 4/2006 | Sin .......................... C09G 1/02 438/689 |
| 2007/0281436 | A1 * | 12/2007 | Sadaka ............. H01L 21/82380 438/400 |

* cited by examiner

*Primary Examiner* — John P Dulka
*Assistant Examiner* — Charles R Peters
(74) *Attorney, Agent, or Firm* — Ding Yu Tan

(57) ABSTRACT

A method for planarizing a semiconductor device includes steps herein. A substrate is provided, on which a stop layer is formed. A trench is formed in the substrate. A first semiconductor film is deposited conformally on the stop layer and the trench. A second semiconductor film is deposited to fill the trench and cover the first semiconductor film. A chemical-mechanical polishing process is performed until the stop layer is exposed. A removal rate of the chemical-mechanical polishing process on the first semiconductor film is higher than that on the second semiconductor film. The first dielectric layer on the substrate selectively is removed.

20 Claims, 6 Drawing Sheets

METHOD FOR PLANARIZING SEMICONDUCTOR DEVICE

FIELD OF THE INVENTION

The present invention generally relates to a semiconductor manufacturing technology and, more particularly, to a method for planarizing a semiconductor device.

BACKGROUND OF THE INVENTION

In the integrated circuit (IC) manufacturing technology, a semiconductor device is typically formed by providing semiconductor, conductor and dielectric on a silicon wafer. Then, the deposited materials are patterned by etching to exhibit circuit features. After the materials are deposited and patterned by etching in sequence, the semiconductor device exhibits poor planarity on the surface thereof, which may cause problems during manufacturing processes, especially during the photolithography process. Therefore, surface planarization of a semiconductor device has become very important.

The chemical mechanical polishing (CMP) is the most widely used planarization technique. However, the CMP technique encounters many challenges. For example, CMP with different pattern densities may result in over-polishing to cause dishing in the trench in the low pattern density region. As a result, open circuits occur due to collapse or breaks in the metal interconnects.

To overcome the problems due to dishing caused by the CMP process, U.S. Pat. No. 6,372,605 provides a method using an additional oxide-reduction etching step performed prior to chemical-mechanical processing so as to reduce the polishing time to prevent dishing for shallow trench isolation processing.

In the present invention, a method for planarizing a semiconductor device is provided by depositing two semiconductor films with different CMP removal rates prior to the CMP process to improve the surface planarity of the semiconductor device.

SUMMARY OF THE INVENTION

It is one object of the present invention to provide a method for planarizing a semiconductor device by depositing two semiconductor films with different CMP removal rates prior to the CMP process to improve the surface planarity of the semiconductor device.

In order to achieve the foregoing object, in one embodiment, the present invention provides a method for planarizing a semiconductor device. The method includes steps herein. A substrate is provided, on which a stop layer is formed. A trench is formed in the substrate. A first semiconductor film is deposited conformally on the stop layer and the trench. A second semiconductor film is deposited to fill the trench and cover the first semiconductor film. A chemical-mechanical polishing (CMP) process is performed until the stop layer is exposed. A removal rate of the CMP process on the first semiconductor film is higher than that on the second semiconductor film.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

Please refer to FIG. 1A to FIG. 1F for cross-sectional views showing the steps for planarizing a semiconductor device according to one embodiment of the present invention.

Figure 1A:
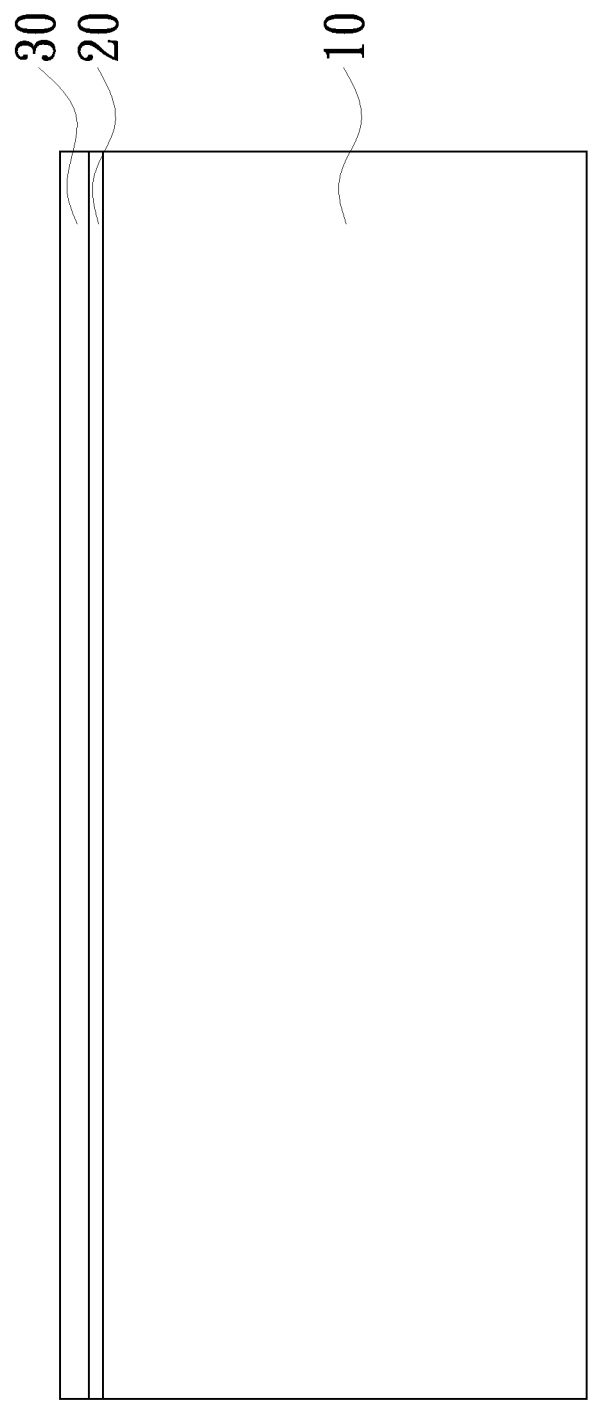
FIG. 1A to FIG. 1F are cross-sectional views showing the steps for planarizing a semiconductor device according to one embodiment of the present invention.

First, as shown in FIG. 1A, a substrate 10 is provided, on which a pad oxide 20 and a stop layer 30 are formed in sequence. In the present embodiment, the substrate 10 may be a silicon substrate, a III-V semiconductor substrate, a sapphire substrate, a silicon on insulator (SOI) substrate, or any other substrate that is provided with electronic elements thereon. In the present embodiment, the pad oxide 20 may be formed by thermal oxidation or deposition. The pad oxide 20 has a thickness of about 50 Å to 150 Å, preferably about 110 Å. In the present embodiment, the stop layer 30 includes silicon nitride, and has a thickness of about 1500 Å to 3000 Å, preferably about 2400 Å.

Figure 1B:
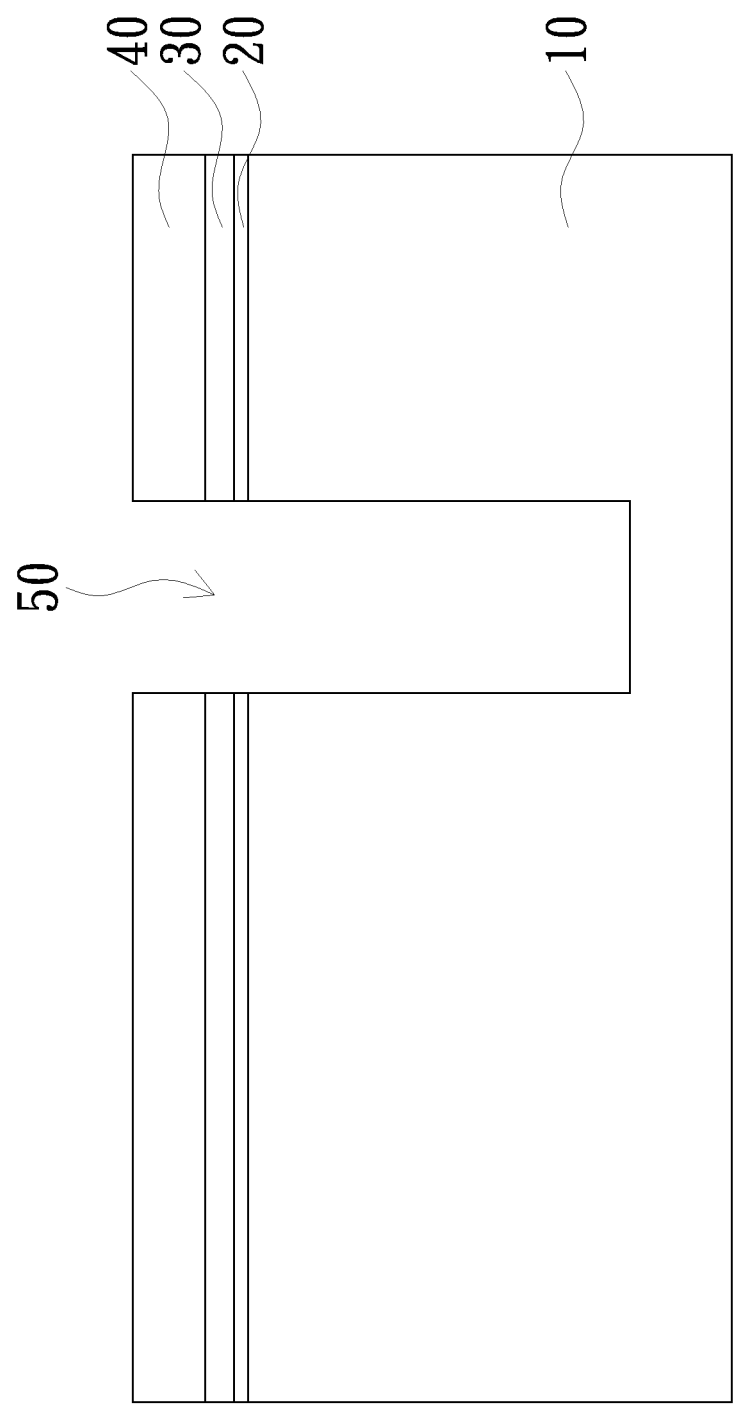

Then, as shown in FIG. 1B, a patterned photoresist layer 40 is provided to pattern the substrate 10, the pad oxide 20 and the stop layer 30 to form a trench 50 in the substrate 10. In the present embodiment, the trench 50 has a width of about 1 μm to 5 μm, preferably about 2.8 μm.

Figure 1C:
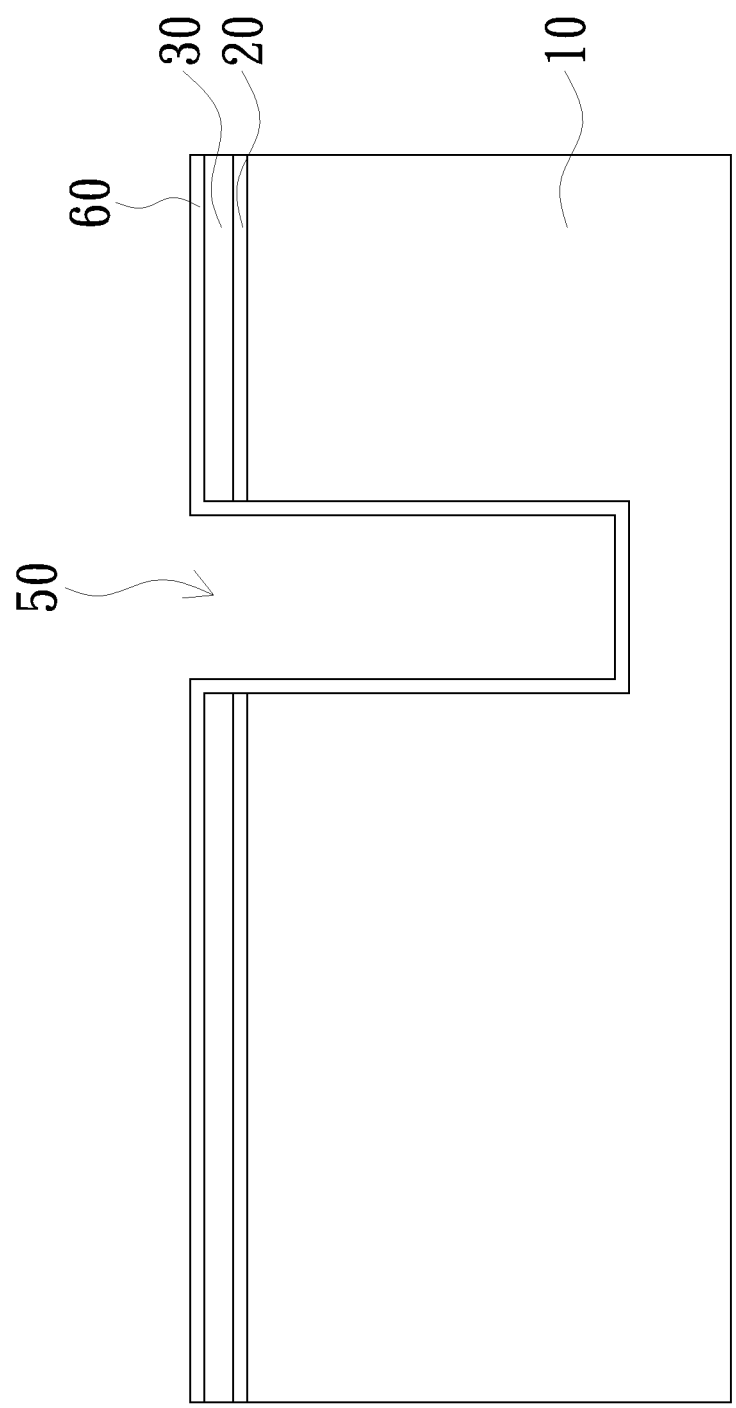

After the patterned photoresist layer 40 is removed, a liner oxide 60 is formed conformally on the stop layer 30 and the trench 50, as shown in FIG. 1C. In the present embodiment, the liner oxide 60 may be formed by thermal oxidation or deposition. The liner oxide 60 has a thickness of about 100 Å to 300 Å, preferably about 200 Å.

Figure 1D:
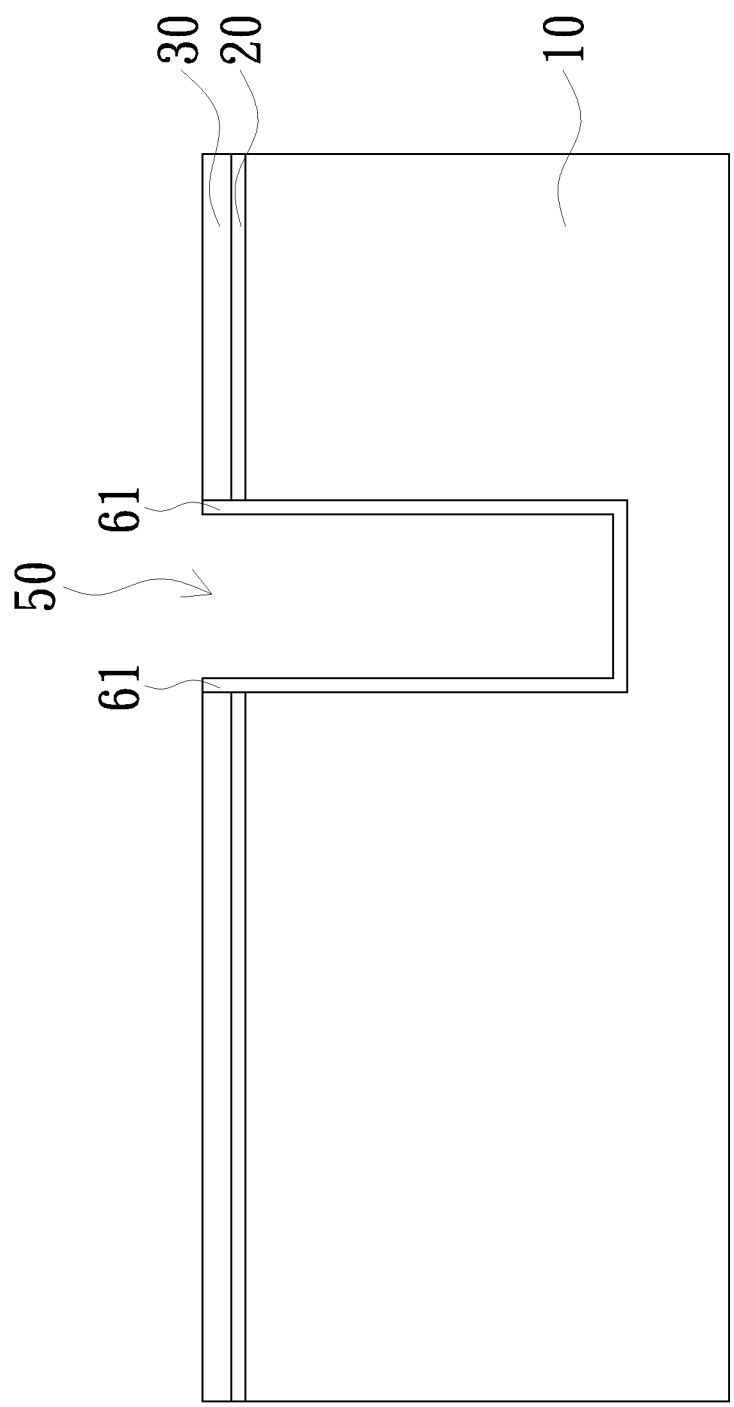

Then, the liner oxide 60 on the stop layer 30 is anisotropically removed so that only the liner oxide 61 on the sidewall and at the bottom of the trench 50 remains, as shown in FIG. 1D. In the present embodiment, the liner oxide 60 is anisotropically removed by dry etching, for example, plasma-enhanced etching.

Figure 1E:
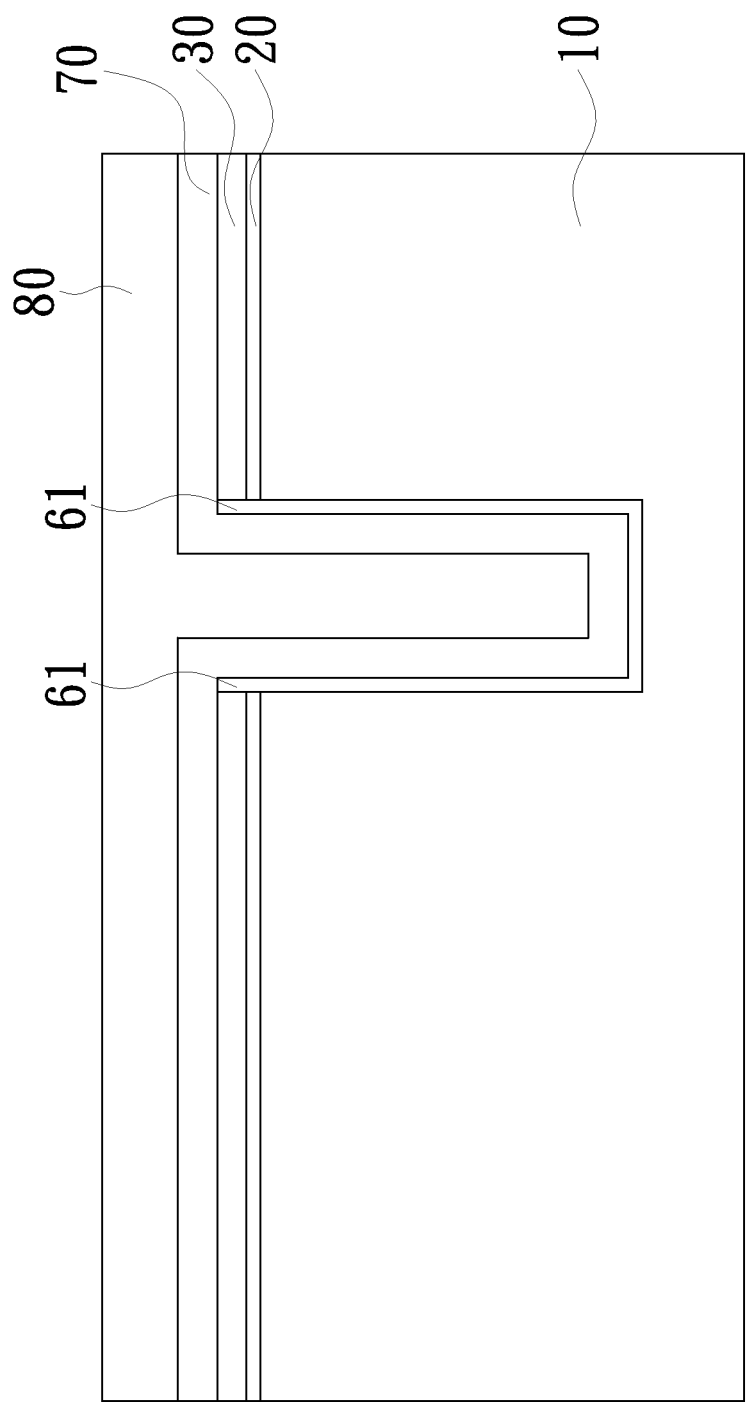

Afterwards, as shown in FIG. 1E, a first semiconductor film 70 and a second semiconductor film 80 are deposited so that the first semiconductor film 70 is conformally formed on the stop layer 30 and the trench 50 and the second semiconductor film 80 fills the trench 30 and covers the first semiconductor film 70. In the present embodiment, the first semiconductor film 70 includes undoped poly-silicon, and the second semiconductor film 80 includes poly-silicon doped with boron (B) or phosphorus (P). As a result, the removal rate of the CMP process on the first semiconductor film 70 and on the second semiconductor film 80 are different. In the present embodiment, the first semiconductor film 70 has a thickness of about 1000 Å to 5000 Å, preferably about 3000 Å.

Figure 1F:
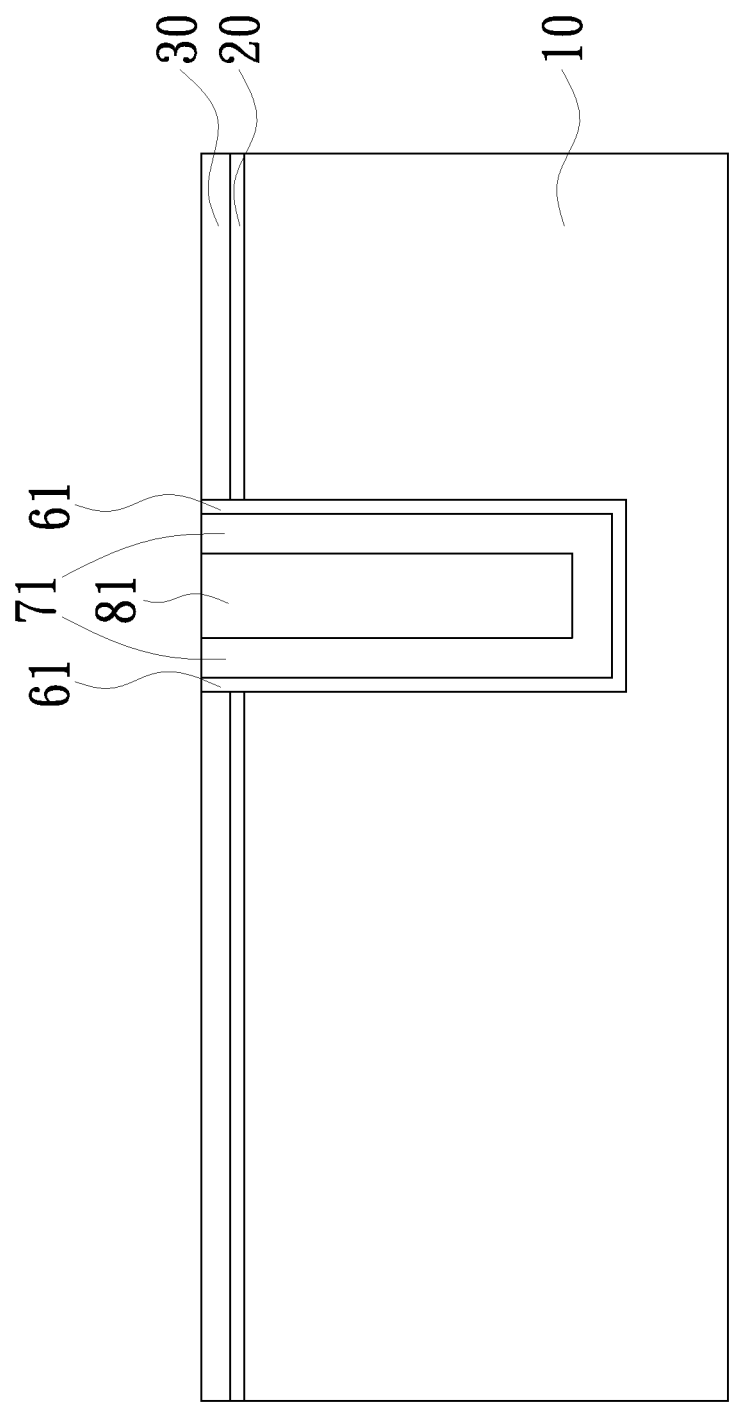

At last, a CMP process is performed to remove the first semiconductor film 70 and the second semiconductor film 80 on the substrate 10 until the stop layer 30 is exposed so that only the first semiconductor film 71 and the second semiconductor film 81 in the trench 50 remain, as shown in FIG. 1F. In the present embodiment, the first semiconductor film 70 includes undoped poly-silicon, and the second semiconductor film 80 includes poly-silicon doped with boron (B) or phosphorus (P). In some embodiments, the CMP process may use a slurry including colloidal silicon dioxide, an organic chemical additive and water. With the use of the slurry, the removal rate of the CMP process on the first semiconductor film 70 and on the second semiconductor film 80 is 70 Å/sec to 130 Å/sec and 30 Å/sec to 60 Å/sec, respectively, and preferably 100 Å/sec and 43.5 Å/sec, respectively. In other words, in the present invention, the removal rate of the CMP process on the first semiconductor film 70 is different from the removal rate of the CMP process on the second semiconductor film 80 when the same slurry is used. When the removal rate of the first semiconductor film 70 is higher than the removal rate of the second semiconductor film 80, the second semiconductor film 81 filling the trench 50 prevents the trench 50 from dishing due to over-polishing. However, it should be noted that, the slurry and the removal rates of the CMP process as previously presented are only exemplary and is not to limit the present invention.

With the use of the method as described with reference to FIG. 1A to FIG. 1F of the present invention, a semiconductor device with improved surface planarity as shown in FIG. 1F can be manufactured to prevent the trench 50 from dishing due to over-polishing the second semiconductor film 81 in the trench 50. As a result, open circuits due to collapse or breaks in the metal interconnects can be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for planarizing a semiconductor device, comprising steps of:
   providing a substrate, on which a stop layer is formed;
   forming a trench in said substrate;
   depositing a U-shaped first semiconductor film conformally on said stop layer and said trench;
   depositing a second semiconductor film to fill said trench and cover said U-shaped first semiconductor film; and
   performing a chemical-mechanical polishing (CMP) process until said stop layer is exposed;
   wherein a removal rate of said CMP process on said U-shaped first semiconductor film is higher than a removal rate of said CMP process on said second semiconductor film, and wherein said U-shaped first semiconductor film is U-shaped in said trench.

2. The method of claim 1, further comprising a step, prior to forming said stop layer, of:
   forming a pad oxide on said substrate.

3. The method of claim 1, further comprising a step, prior to depositing said U-shaped first semiconductor film, of:
   forming a liner oxide conformally on said stop layer and said trench, respectively.

4. The method of claim 3, further comprising a step, after forming said liner oxide, of:
   anisotropically removing said liner oxide on said stop layer.

5. The method of claim 4, wherein said liner oxide on said stop layer is removed by plasma-enhanced etching.

6. The method of claim 1, wherein said stop layer comprises silicon nitride.

7. The method of claim 1, wherein said stop layer has a thickness of about 1500 Å to 3000 Å.

8. The method of claim 7, wherein said stop layer has a thickness of about 2400 Å.

9. The method of claim 1, wherein said trench has a width of about 1 μm to 5 μm.

10. The method of claim 9, wherein said trench has a width of about 2.8 μm.

11. The method of claim 1, wherein said U-shaped first semiconductor film comprises undoped poly-silicon.

12. The method of claim 11, wherein said chemical-mechanical polishing process uses a slurry comprising colloidal silicon dioxide, an organic chemical additive and water.

13. The method of claim 12, wherein said removal rate of said CMP process on said U-shaped first semiconductor film is about 70 Å/sec to 130 Å/sec.

14. The method of claim 13, wherein said removal rate of said CMP process on said U-shaped first semiconductor film is about is about 100 Å/sec.

15. The method of claim 1, wherein said second semiconductor film comprises boron-doped poly-silicon or phosphorus-doped poly-silicon.

16. The method of claim 15, wherein said CMP process uses a slurry comprising colloidal silicon dioxide, an organic chemical additive and water.

17. The method of claim 16, wherein said removal rate of said CMP process on said second semiconductor film is about 30 Å/sec to 60 Å/sec.

18. The method of claim 17, wherein said removal rate of said CMP process on said second semiconductor film is about 43.5 Å/sec.

19. The method of claim 1, wherein said U-shaped first semiconductor film has a thickness of about 1000 Å to 5000 Å.

20. The method of claim 19, wherein said U-shaped first semiconductor film has a thickness of about 3000 Å.

* * * * *